United States Patent [19]
Um

[11] Patent Number: 5,689,380
[45] Date of Patent: Nov. 18, 1997

[54] THIN FILM ACTUATED MIRROR ARRAY FOR PROVIDING DOUBLE TILT ANGLE

[75] Inventor: Gregory Um, Torrance, Calif.

[73] Assignee: Aura Systems, Inc., El Segundo, Calif.

[21] Appl. No.: 424,149

[22] Filed: Apr. 17, 1995

Related U.S. Application Data

[63] Continuation-in-part of Ser. No. 200,861, Feb. 23, 1994, Pat. No. 5,481,396.

[51] Int. Cl.⁶ .................. G02B 7/182; G02B 26/08; H01L 41/08
[52] U.S. Cl. .................. 359/846; 359/224; 359/291; 359/295; 359/872; 310/328; 310/331
[58] Field of Search .................. 359/224, 225, 359/291, 295, 846, 849, 855, 872; 310/328, 330, 331, 332

[56] References Cited

U.S. PATENT DOCUMENTS

| | | | |
|---|---|---|---|
| 4,383,763 | 5/1983 | Hutchings et al. | 310/332 |
| 4,716,331 | 12/1987 | Higgins, Jr. | 210/330 |
| 4,915,492 | 4/1990 | Toth | 310/332 |
| 5,085,497 | 2/1992 | Um et al. | 359/855 |
| 5,116,128 | 5/1992 | Hall et al. | 310/332 |
| 5,469,302 | 11/1995 | Lim | 359/846 |
| 5,506,720 | 4/1996 | Yoon | 359/224 |

Primary Examiner—Ricky D. Shafer
Attorney, Agent, or Firm—Lisa A. Merkadeau

[57] ABSTRACT

A thin film actuated mirror for an actuated mirror array includes a pedestal, a piezoelectric structure mounted to the pedestal, and a mirror surface interconnected to the piezoelectric structure such that the mirror surface tilts in response to the deformation of the piezoelectric material layer. The pedestal includes a first pedestal section and a second pedestal section, and the piezoelectric structure is divided into a first portion and a second portion. The piezoelectric structure includes a piezoelectric material layer having two opposing surfaces, and two metal electrodes, the electrodes being mounted on opposing surfaces of the piezoelectric material. The piezoelectric structure first portion is mounted to the first pedestal section at a proximal end of the piezoelectric structure and the second portion is mounted to the second pedestal section at a distal end of the piezoelectric structure.

7 Claims, 2 Drawing Sheets

THIN FILM ACTUATED MIRROR ARRAY FOR PROVIDING DOUBLE TILT ANGLE

RELATED APPLICATION DATA

This application is a continuation-in-part of commonly owned, co-pending Ser. No. 08/200,861, which was filed on Feb. 23, 1994, now U.S. Pat. No. 5,481,396 and is incorporated by reference herein.

FIELD OF THE INVENTION

The present invention relates generally to actuated mirror arrays for optical projection video systems, and more particularly to thin film actuated mirror arrays for optical projection systems.

BACKGROUND OF THE INVENTION

In a particular type of an optical projection video display system, an actuated mirror array is used to control the light modulation for each pixel. In one system, the mirror array is illuminated by a source of optical energy. Under electronic control, the orientation of each of the mirrors in the array is varied to determine a propagation path for a beam of light reflecting from each mirror. An example of an optical projection video display system is shown in FIG. 1. In this system light is emitted from a light source 120, and is reflected off a Schlieren stop mirror 122 at an angle toward the actuated mirror array 124. The light is reflected from the actuated mirror array at a controlled angle. The angle is controlled through the actuation of the mirror array. The light reflected from the mirror array 124 passes through a second lens 126, bypasses the Schlieren stop mirror, and passes through a third lens 128 to a screen. The present invention discloses actuated mirrors for mirror arrays used in such an optical projection video display system.

A unimorph is a piezoelectric element externally bonded to a metal material layer. The metal layer is controlled by applying a DC electrical signal across the piezoelectric material, which causes the piezoelectric material to change shape. The change in shape of the piezoelectric material causing an axial buckling or deflection in the metal layer as the metal layer opposes movement of the piezoelectric material. The degree of buckling of the metal layer is controlled by the amplitude of the DC electrical signal. A bimorph includes two layers of piezoelectric element. It is known in the art to create unimorph and bimorph piezoelectric elements by direct deposition or using adhesives to bond the metal layer to the piezoelectric elements. For example, U.S. Pat. No. 5,085,497 discloses methods for fabricating mirror arrays for optical projection systems.

The known actuated mirror arrays, however, only provide a single tilt angle for each piezoelectric material layer. For these reasons, a thin film actuated mirror array that provides double tilt angle is needed.

SUMMARY OF THE INVENTION

Accordingly, it is a primary object of the present invention to overcome one or more disadvantages and limitations of the prior art. A significant object of the present invention is to provide an actuated mirror array having a high resolution and ease of fabrication.

Another aspect of the present invention is to provide an actuated mirror array that provides a double tilt angle of displacement.

According to a broad aspect of the present invention, a thin film actuated mirror for an actuated mirror array includes a pedestal, a piezoelectric structure mounted to the pedestal, and a mirror surface interconnected to the piezoelectric structure such that the mirror surface tilts in response to the deformation of the piezoelectric material layer. The pedestal includes a first pedestal section and a second pedestal section, and the piezoelectric structure is divided into a first portion and a second portion. The piezoelectric structure includes a piezoelectric material layer having two opposing surfaces, and two metal electrodes, the electrodes being mounted on opposing surfaces of the piezoelectric material. The piezoelectric structure first portion is mounted to the first pedestal section at a proximal end of the piezoelectric structure and the second portion is mounted to the second pedestal section at a distal end of the piezoelectric structure.

A feature of the present invention is that the thin film actuated mirror arrays are easily manufactured.

Another feature of the present invention is that the thin film actuated mirror arrays provide a double tilt angle of displacement.

These and other objects, advantages and features of the present invention will become readily apparent to those skilled in the art from a study of the following description of an exemplary preferred embodiment when read in conjunction with the attached drawing and appended claims.

DESCRIPTION OF AN EXEMPLARY PREFERRED EMBODIMENT

Figure 1:
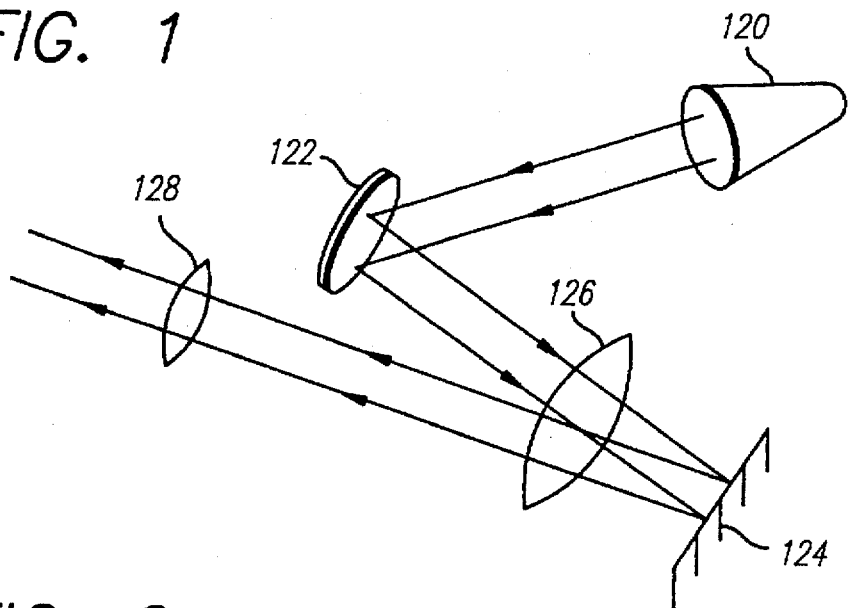
FIG. 1 is a diagram showing an optics implementation of the thin film actuated mirror array.
Figure 2:
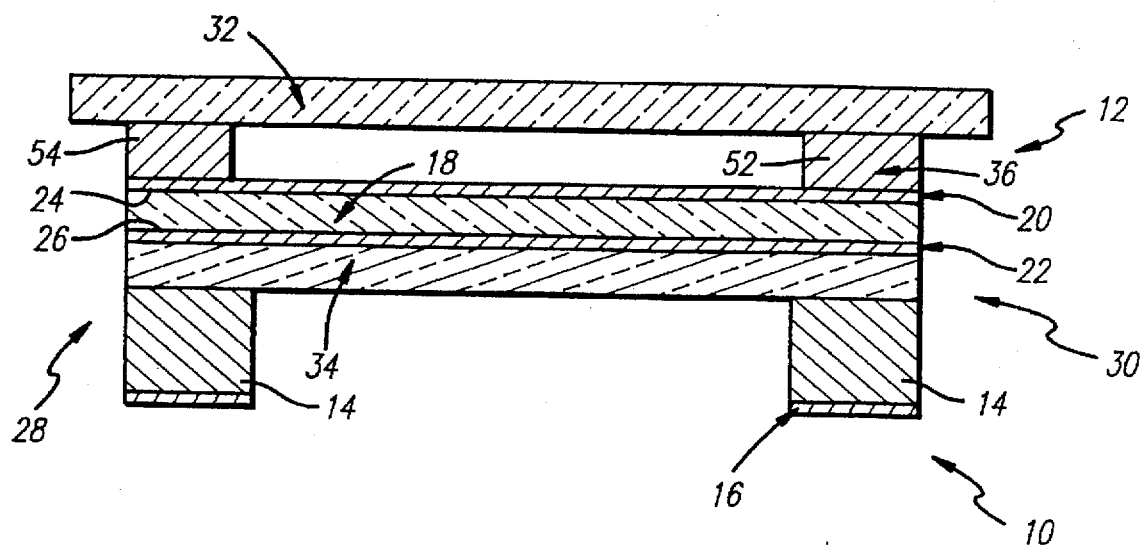
FIG. 2 is a side view of a first embodiment of a thin film actuated mirror array.

Referring first to FIG. 2, a first embodiment 10 of a thin film actuated mirror array of the present invention is described. The first embodiment 10 includes a piezoelectric structure 12, a pedestal member 14, and a substrate 16. The piezoelectric structure 12 includes a layer of piezoelectric material 18 disposed intermediate a first layer of metal 20 and a second layer of metal 22. The piezoelectric material layer 18 has an upper surface 24 and a lower surface 26. The first layer of metal 20 is in contact with the upper surface 24 of the piezoelectric material layer and functions as a metal electrode. The second layer of metal 22 is in contact with the lower surface 26 of the piezoelectric material layer and also functions as a metal electrode. The piezoelectric structure 12 defines a proximal end 28 and a distal end 30.

The piezoelectric structure 12 is supported by the pedestal member 14. The pedestal member 14 is coupled to the substrate 16. A mirror surface member 32 is interconnected to the first layer of metal 20. The piezoelectric structure 12 may further include an inactive layer 34. The inactive layer 34 is disposed intermediate the pedestal member 14 and the second layer of metal 22. The first embodiment 10 of the thin film actuated mirror array may further include a spacer member 36 mounted between the piezoelectric structure 12 and the mirror surface member 32.

Figure 3:
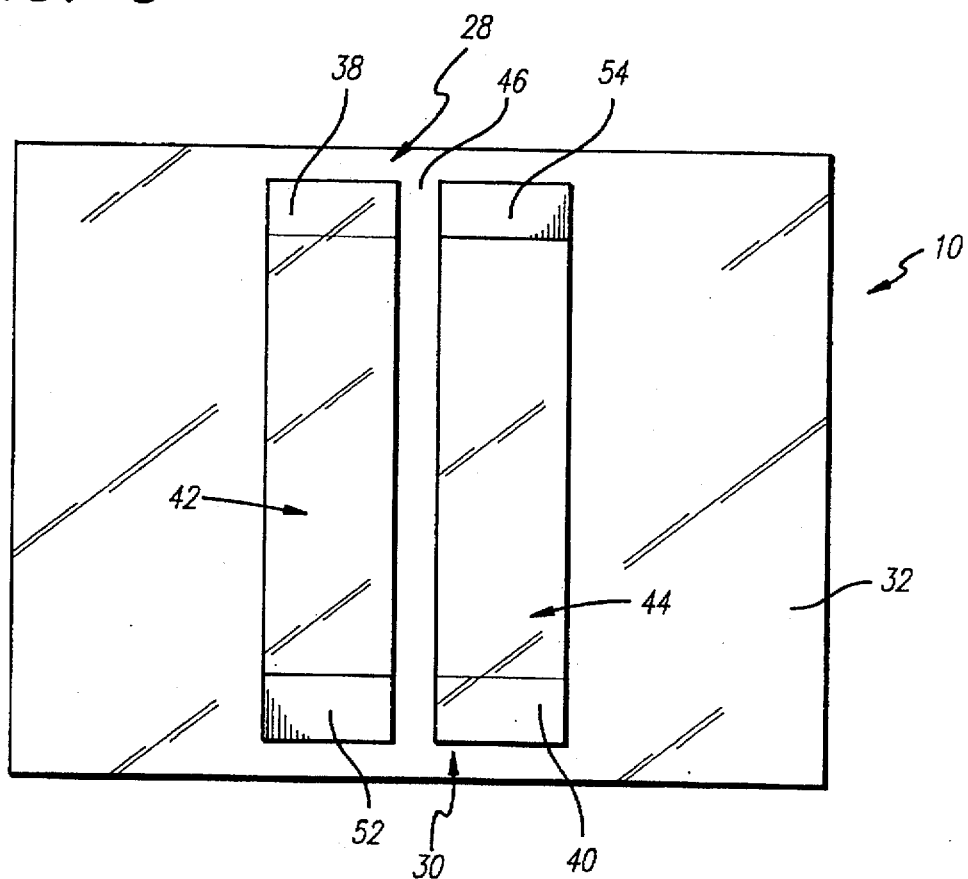
FIG. 3 is a top view of the first embodiment of the thin film actuated mirror array of FIG. 2.
Figure 4:
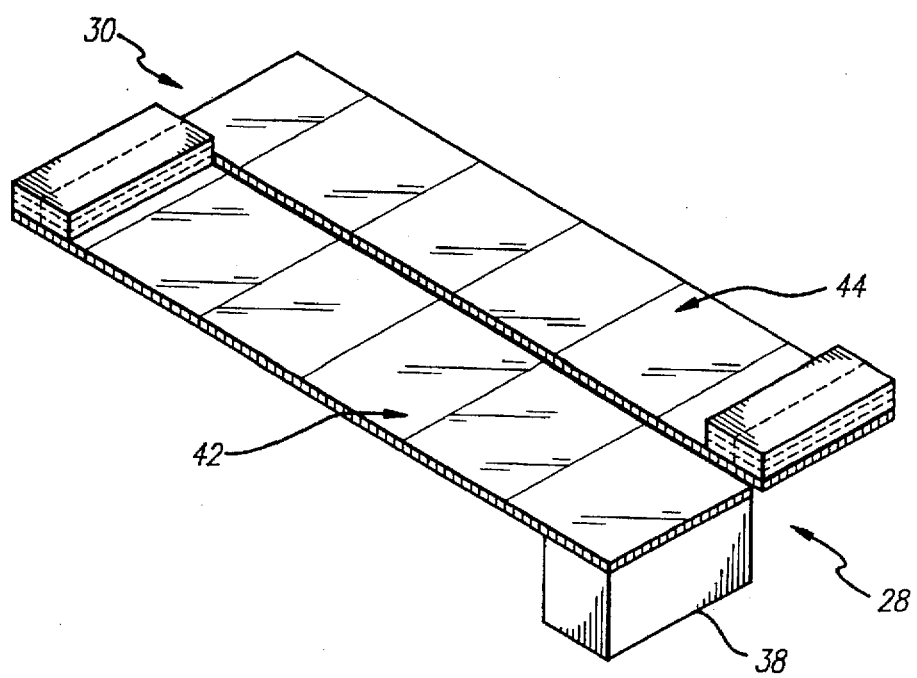
FIG. 4 is a plan view of the first embodiment of the thin film actuated mirror array of FIG. 2.

Referring now to FIGS. 3 and 4, the first embodiment 10 is shown as having the piezoelectric structure 12 divided into a first portion 42 and a second portion 44. The two portion 42 and 44 combine to act as one pixel. More specifically, the pedestal 14 of the first embodiment 10 includes a first pedestal section 38 and a second pedestal section 40. The first pedestal section 38 is disposed at the proximal end 28 of the piezoelectric structure and the second pedestal section 40 is disposed at a distal end 30 of the piezoelectric structure. The piezoelectric structure is divided into the first portion 42 and the second portion 44. The piezoelectric structure first portion 42 is mounted to the first pedestal section 38 at the proximal end 28 of the piezoelectric structure, such that the piezoelectric structure first portion 42 is cantilevered from the first pedestal section 38 and preferably does not contact the second pedestal section 40. The piezoelectric structure second portion 44 is mounted to the second pedestal section 40 at the distal end 30 of the piezoelectric structure, such that the piezoelectric structure second portion 44 is cantilevered from the second pedestal section 40 and preferably does not contact the first pedestal section 38. The first and section portions 42,44 of the piezoelectric structure are preferably mounted such that they are separated by a narrow gap 46, as best shown in FIG. 3.

In use, when an electrical field is applied across the piezoelectric structure 12 from the substrate active matrix 16 through the pedestal 14 which conducts the electrical signal, the application of the electric field will either cause the piezoelectric material to contract or expand, depending on the polarity of the electric field with respect to the poling of the piezoelectric material. By way of example, if the polarity of the electric field corresponds to the polarity of the piezoelectric material, the piezoelectric material will contract. If the polarity of the electric field is opposite the polarity of the piezoelectric material, the piezoelectric material will expand.

Figure 5:
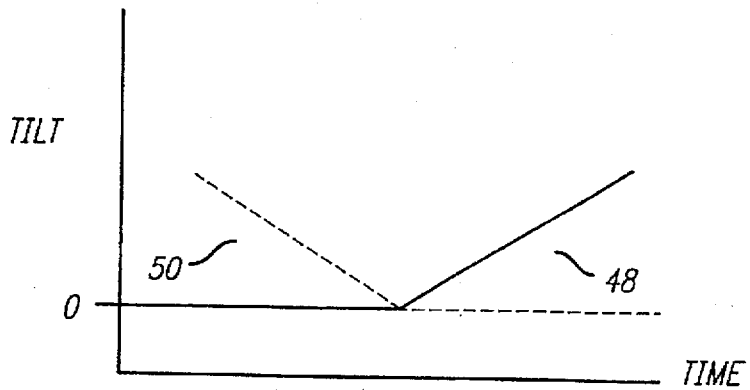
FIG. 5 is a chart showing the double tilt angle of the thin film actuated mirror array.

Referring to FIG. 5, the use of the first embodiment 10 of the thin film actuated mirror array to create a double tilt angle is described. For purposes of explanation, it is assumed that the polarity of the piezoelectric material and electric field is such that the piezoelectric material will contract. Therefore, when the electric field is applied across the piezoelectric material layer first portion 42, the piezoelectric material first portion contracts. As a result, the piezoelectric layer first portion 42 tilts upward from the first pedestal section 38, and the mirror surface member 32 tilts upward at an angle 48 as designated in FIG. 5. The force of the tilting of the mirror surface member 32 causes the piezoelectric layer second portion 44 to also tilt at the same angle. When the electric field is applied across the piezoelectric material layer second portion 44, the piezoelectric material second portion contracts. As a result, the piezoelectric layer second portion 44 tilts upward from the second pedestal section 40, and the mirror surface member 32 tilts upward at an angle 50 as designated in FIG. 5. The force of the tilting of the mirror surface member 32 causes the piezoelectric layer first portion 42 to also tilt at the same angle. As shown in FIG. 5, angle 48 is the reverse of angle 50, thereby creating the double tilt angle.

As previously described, the piezoelectric structure may include a spacer 36. In the embodiment shown in FIGS. 3 and 4, the spacer 36 is comprised of a first spacer member 52 and a second spacer member 54. The first spacer member 52 corresponds to the piezoelectric structure first portion 42. The piezoelectric structure first portion 42 is mounted to the pedestal member first section 38 at the proximal end 28 of the piezoelectric material structure, and the first spacer member 52 is disposed on the distal end 30 of the piezoelectric material structure. A small section of the mirror layer 32 is secured to the first spacer member 52 such that the mirror layer is partially cantilevered from the first spacer member 52. The second spacer member 54 corresponds to the piezoelectric structure second portion 44. The piezoelectric structure second portion 44 is mounted to the pedestal member second section 40 at the distal end 30 of the piezoelectric material structure, and the second spacer member 54 is disposed on the proximal end 28 of the piezoelectric material structure. A small section of the mirror layer 32 is secured to the second spacer member 54 such that the mirror layer 32 is also partially cantilevered from the second spacer member 54.

The spacer members 52 and 54 increases the effective length of the mirror surface 32. More specifically, when an electric field is applied across the piezoelectric material causing the piezoelectric structure to bend upward, the mirror will tilt upward at an angle, but remain planar because of the use of the spacer. As a result, the effective length of the mirror is the entire length of the mirror. In comparison, if the mirror layer is directly secured to the piezoelectric material layer, instead of to the spacer member, the portion of the mirror secured to the pedestal does not deform in reaction to the electric field, but instead remains securely in place. As a result, the effective length of the mirror is the length if the mirror less the length of the portion of the piezoelectric material secured to the pedestal. The implementation of the spacer and mirror layer therefore increases the fill factor and efficiency of the mirror array. As an additional benefit, the thickness of the mirror layer is easily varied.

In an alternative embodiment of the thin film actuated mirror array the piezoelectric structure 12 may be comprised of a bimorph piezoelectric structure (not shown). The bimorph structure has an upper piezoelectric material layer, a lower piezoelectric material layer, a first layer of metal, a second layer of metal, and a third layer of metal. The first layer of metal is disposed above and in contact with the upper piezoelectric material layer and is interconnected to the mirror surface. The second layer of metal is disposed below and in contact with the lower piezoelectric material layer. The third layer of metal is disposed intermediate and in contact with the upper piezoelectric material layer lower surface and the lower piezoelectric material layer upper surface. The bimorph structure provides the additional capability of tilting either at an upward or a downward angle. If a bimorph structure is used, the first and second piezoelectric structure portions 42,44 are actuated exactly out-of phase with each other.

It is to be noted that although the descriptions of the embodiments refer to piezoelectric material, other type of motion-inducing material may be used. For example, electrostrictive or magnetostrictive material may be used to obtain the desired expansion of shrinkage.

There has been described hereinabove several exemplary preferred embodiments of the thin film actuated mirror array according to the principles of the present invention. Those skilled in the art may now make numerous uses of, and departures from, the above-described embodiments without departing from the inventive concepts disclosed herein. Accordingly, the present invention is to be defined solely by the scope of the following claims.

I claim as my invention:

1. A thin film actuated mirror comprising:
   a pedestal, said pedestal including a first pedestal section and a second pedestal section;
   at least one piezoelectric structure mounted to said pedestal, said piezoelectric structure further comprising a piezoelectric material layer having two opposing surfaces, and two metal electrodes, each of said electrodes being mounted on a respective one of said opposing surfaces of said piezoelectric material, wherein an electrical signal applied across said piezoelectric material between said electrodes causes horizontal deformation of said piezoelectric material layer and further wherein said structure is being mounted to said first pedestal section at a proximal end of said piezoelectric material layer, and further wherein said structure is divided into a first portion and a second portion, said first portion being mounted to said first pedestal section at a proximal end of said piezoelectric structure and said second portion being mounted to said second pedestal section at a distal end of said piezoelectric structure; and a mirror surface, said mirror surface being interconnected to both said proximal and distal ends of said piezoelectric structure such that said mirror surface tilts at a double angle in response to the deformation of said piezoelectric material layer.

2. A thin film actuated mirror in accordance with claim 1 wherein said mirror surface is mounted directly to one of said metal electrodes.

3. A thin film actuated mirror in accordance with claim 1 further comprising:

a first spacer member mounted intermediate said first portion and said mirror surface; and a second spacer member mounted intermediate said second portion and said mirror surface.

4. A thin film actuated mirror in accordance with claim 3 wherein said first spacer member is mounted to said piezoelectric structure distal end and said second spacer member is mounted to said piezoelectric structure second portion at said piezoelectric structure proximal end.

5. A thin film actuated mirror in accordance with claim 1 wherein said piezoelectric structure first portion and said piezoelectric structure second portion are separated by a narrow gap.

6. A thin film actuated mirror in accordance with claim 1 wherein said piezoelectric structure is a bimorph structure.

7. A thin film actuated mirror in accordance with claim 1 wherein said piezoelectric structure further comprises an inactive material layer disposed intermediate said pedestal and said second metal electrode.

* * * * *